(12) United States Patent
Ellsworth, Jr. et al.

(10) Patent No.: US 7,222,423 B2
(45) Date of Patent: May 29, 2007

(54) METHOD OF MANUFACTURING A FINNED HEAT SINK

(75) Inventors: Michael J. Ellsworth, Jr., Lagrangeville, NY (US); Egidio Marotta, Poughkeepsie, NY (US); Prabjit Singh, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/130,755

(22) Filed: May 17, 2005

(65) Prior Publication Data

US 2005/0205240 A1    Sep. 22, 2005

Related U.S. Application Data

(62) Division of application No. 10/161,792, filed on Jun. 4, 2002, now Pat. No. 6,918,438.

(51) Int. Cl.
    *B21D 53/02*    (2006.01)
(52) U.S. Cl. ............... 29/890.039; 165/185; 165/905; 361/704; 29/890.03
(58) Field of Classification Search ............ 29/890.03, 29/890.032, 890.039; 165/185, 80.3, 905; 361/704, 705, 709, 688
    See application file for complete search history.

(56) References Cited

U.S. PATENT DOCUMENTS

| 5,100,737 | A |   | 3/1992  | Colombier et al. |
| 5,520,976 | A |   | 5/1996  | Giannetti et al. |
| 5,769,158 | A |   | 6/1998  | Yao |
| 5,863,467 | A |   | 1/1999  | Mariner et al. |
| 5,949,650 | A |   | 9/1999  | Bulante et al. |
| 6,009,937 | A |   | 1/2000  | Gonner et al. |
| 6,075,701 | A |   | 6/2000  | Ali et al. |
| 6,131,651 | A | * | 10/2000 | Richey, III .................. 165/185 |
| 6,208,513 | B1 |  | 3/2001  | Fitch et al. |
| 6,215,661 | B1 |  | 4/2001  | Messenger et al. |
| 6,223,814 | B1 |  | 5/2001  | Moresco et al. |
| 6,503,626 | B1 |  | 1/2003  | Norley et al. |
| 6,538,892 | B2 |  | 3/2003  | Smalc |
| 6,684,501 | B2 |  | 2/2004  | Ellsworth et al. |
| 2002/0108743 | A1 | * | 8/2002 | Wirtz .......................... 165/185 |
| 2003/0178190 | A1 |  | 9/2003 | Ellsworth et al. |

FOREIGN PATENT DOCUMENTS

| GB | 2045527 A   | 10/1980 |
| WO | WO 99/14805 | 3/1999  |

* cited by examiner

*Primary Examiner*—Marc Jimenez
(74) *Attorney, Agent, or Firm*—Cantor Colburn LLP

(57) ABSTRACT

A method of manufacturing a finned heat sink included obtaining a fin core, wherein the fin core is constructed of a conductive structural graphite-epoxy material. A fin cover is secured to the fin core using one of heat and pressure to define a heat sink fin, wherein the fin cover is constructed of a foil material.

10 Claims, 4 Drawing Sheets

METHOD OF MANUFACTURING A FINNED HEAT SINK

CROSS-REFERENCE TO RELATED APPLICATIONS

This application is a divisional of U.S. patent application Ser. No. 10/161,792 filed Jun. 4, 2002, now U.S. Pat. No. 6,918,438, the contents of which are incorporated by reference herein in their entirety.

FIELD OF THE INVENTION

The present invention relates generally to a heat sink and more particularly to a finned heat sink having copper-clad graphite foils.

BACKGROUND OF THE INVENTION

As an electronic component operates, the electron flow within the component generates heat. If this heat is not removed, or dissipated, the electronic component may not operate correctly and may become damaged. Typically, the heat generated by the electronic component is dissipated by a cooling means, such as an aluminum (Al) or copper (Cu) heat sink which absorbs and dissipates the heat via direct air convection. These conventional heat sinks are well known in the electronics industry and are used extensively to dissipate heat generated by electronic components used in computers and various other electronic equipment.

Moreover, improvements in integrated circuit (IC) design and fabrication techniques are allowing IC manufacturers to produce smaller IC devices and other electronic components which operate at increasingly faster speeds and which perform an increasingly higher number of operations. As the operating speed and operational parameters of an electronic component increases, so too does the heat generated by these components. As a result, conventional aluminum (Al) and/or copper (Cu) heat sink designs gave way to current state-of-the-art graphite-epoxy finned heat sink designs, thus allowing for a faster and larger heat dissipation capability.

However, these graphite-epoxy finned heat sink designs have two main disadvantages. The first disadvantage is that current finned heat sink designs are mechanically fragile, thus allowing graphite-epoxy material to be ejected from the heat sink resulting in the contamination of neighboring electronic hardware with graphite-epoxy debris. Current methods to combat this problem include electroplating the finished heat sink assembly with electroless nickel. However, because electroless nickel is mechanically highly stressed, the nickel plating may easily peel. In addition, corrosion may occur due to plating solution becoming trapped within the crevices of the heat sink. Moreover, electroless nickel plating is expensive, adding to the already expensive manufacturing process.

The second disadvantage is that the graphite-epoxy composite is difficult to join to metals using conventional soldering operations, thus resulting in an increase in manufacturing/production cost and complexity.

SUMMARY OF THE INVENTION

A finned heat sink comprising: a plurality of heat sink fins, wherein each of the plurality of heat sink fins includes a fin cover and a fin core, wherein the fin core is constructed of a conductive structural graphite-epoxy material and wherein the fin cover is constructed of a foil material and is disposed relative to the fin core so as to envelope the fin core and a heat sink base, wherein the heat sink base is disposed so as to be in thermal communication with the plurality of heat sink fins.

BRIEF DESCRIPTION OF THE DRAWINGS

Referring to the exemplary drawings wherein like elements are numbered alike in the several Figures.

DETAILED DESCRIPTION OF THE INVENTION

Figure 1:
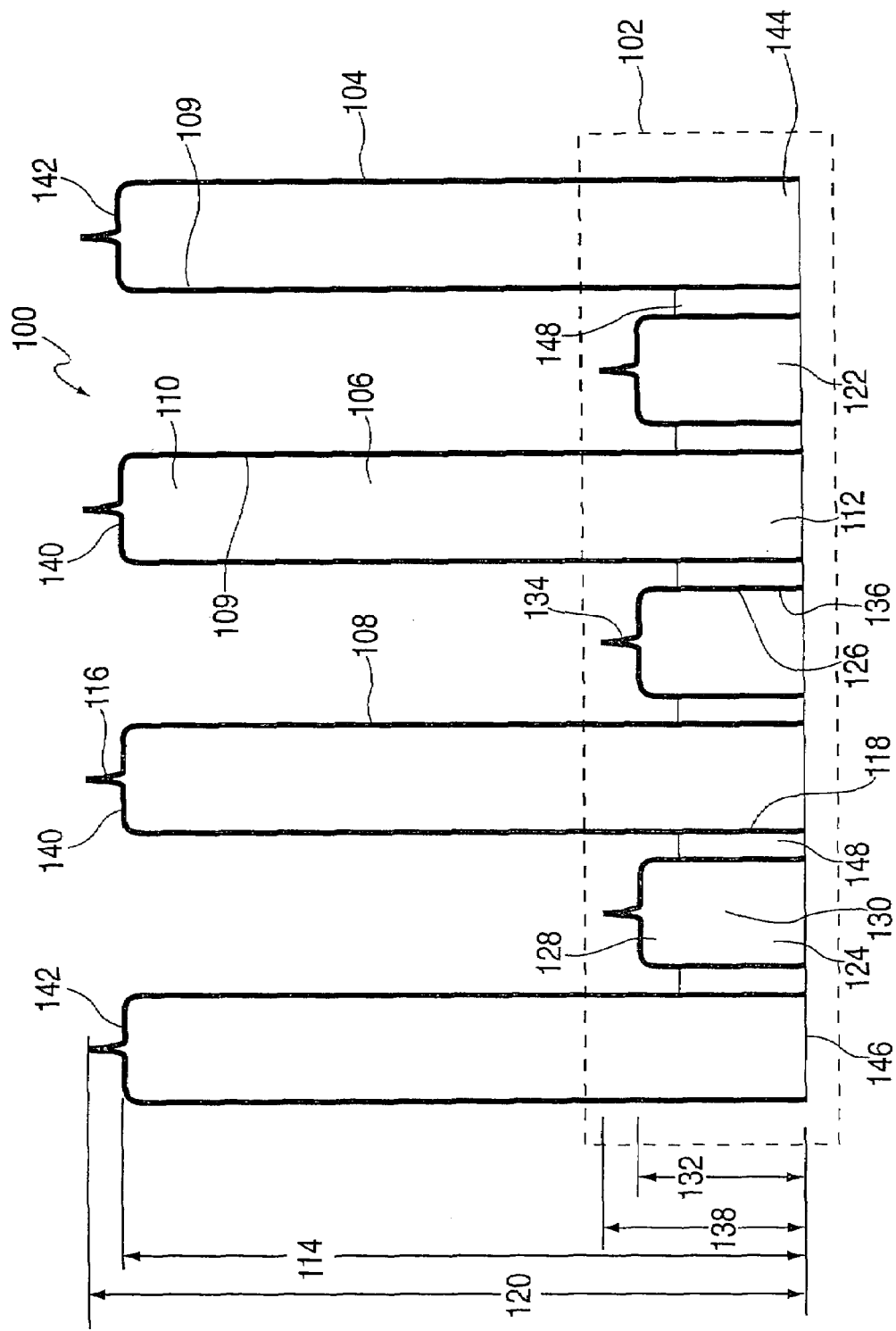
FIG. 1 is a sectional side view of a graphite-epoxy finned heat sink, in accordance with a first embodiment.

Referring to FIG. 1, a finned heat sink 100 in accordance with a first embodiment is shown and discussed. Finned heat sink 100 includes a heat sink base 102 and a plurality of heat sink fins 104. Heat sink fins 104 include a fin core 106 and a fin cover 108, wherein fin cover 108 includes a fin cover face 109 and wherein fin cover 108 is non-movably associated with fin core 106. In addition, fin cover 108 is thermally communicated with fin core 106 so as to allow for a maximum amount of heat transfer. Fin core 106 includes a core top 110, a core bottom 112 and has a core length 114. Fin cover 108 includes a cover top 116, a cover bottom 118 and a cover length 120, wherein cover length 120 is preferably larger than core length 114. Fin cover 108 is disposed relative to fin core 106 such that fin cover face 109 is adjacent to fin core 106 and such that cover bottom 118 is adjacent to core bottom 112 and cover top 116 extends beyond core top 110. Cover top 116 is sealed so as to enclose core top 110 within fin cover 108.

Heat sink base 102 includes a plurality of fin spacers 122 having a spacer core 124 and a spacer cover 126, wherein spacer cover 126 is non-movably associated with spacer core 124. In addition, spacer cover 126 is thermally communicated with spacer core 124 so as to allow for a maximum amount of heat transfer. Spacer core 124 includes a spacer core top 128, a spacer core bottom 130 and a spacer core length 132. Spacer cover 126 includes a spacer cover top 134, a spacer cover bottom 136 and a spacer cover length 138, wherein spacer cover length 138 is preferably larger than spacer core length 132. Spacer cover 126 is disposed relative to spacer core 124 such that spacer cover bottom 136 is adjacent to spacer core bottom 130 and spacer cover top 134 extends beyond spacer core top 128. Spacer cover top 134 is sealed so as to enclose spacer core top 128 within spacer cover 126.

Finned heat sink 100 includes a plurality of internal heat sink fins 140 and a plurality of external heat sink fins 142 and is formed by positioning internal heat sink fins 140 between external heat sink fins 142 in a sandwich fashion such that external heat sink fins 142 are disposed on the outer most portion of finned heat sink 100. External heat sink fins 142 are disposed so as to be parallel to internal heat sink fins 140 such that core top 110 of each heat sink fin 104 is adjacent to the core top 110 of the neighboring heat sink fin 104. Fin spacers 122 are non-movably disposed between heat sink fins 104 in a sandwich fashion so as to separate heat sink fins 104 from each other such that core bottom 112 is adjacent to spacer core bottom 130. In addition, heat sink fins 104 are preferably thermally communicated with fin spacers 122 so as to allow efficient thermal transfer between heat sink fins 104 and fin spacers 122.

Heat sink base 102 also includes a base bottom 144 having a bottom material layer 146 constructed of a thermally conductive material, wherein bottom material layer 146 is disposed so as to seal cover bottom 118 to core bottom 112 and spacer cover bottom 136 to spacer core bottom 130.

Fin core 106 is preferably constructed of a conductive structural graphite-epoxy material and is advantageously contained within fin cover 108 so as to prevent the contamination of neighboring hardware with graphite-epoxy debris. This is because cover top 116 is sealed so as to enclose core top 110 within fin cover 108 and cover bottom 118 is sealed by bottom material layer 146 so as to enclose core bottom 112 within fin cover 108. In addition, this advantageously allows fin core 106 to be contained with fin cover 108 without the problems associated with electroless nickel plating.

Although heat sink fins 104 and fin spacers 122 are preferably non-movably associated using a thermally conductive soldering material 148, heat sink fins 104 and fin spacers 122 may be non-movably associated using any method and/or device suitable to the desired end purpose. In addition, bottom material layer 146 may be non-movably associated with base bottom 144 via any method and/or device suitable to the desired end purpose, such as electroplating, physical vapor deposition and/or sputtering.

Although fin cover 108 is preferably constructed of 0.375 oz copper foil as known in the circuit board industry, fin cover 108 may be constructed of any material suitable to the desired end purpose. In addition, although fin cover 108 is preferably solid a foil material, fin cover 108 may also be a screened foil material. Moreover, although cover top 116 and spacer cover top 134 are preferably sealed via soldering and/or crimping, cover top 116 and spacer cover top 134 may be sealed using any method and/or device suitable to the desired end purpose. Moreover, fin cover 108 may be processed to promote material adhesion via any method or device suitable to the desired end purpose such as roughening.

In accordance with a first embodiment, fin cover 108 includes a copper-oxide treatment on fin cover face 109. This copper-oxide treatment advantageously promotes the adhesion of fin cover face 109 to fin core 106. Fin cover face 109 may be bonded to graphite-epoxy material of fin core 106 by compressing fin cover face 109 against fin core 106 while the graphite-epoxy material of fin core 106 is heated to a temperature range in which the graphite-epoxy material is pliable. This advantageously allows an epoxy-copper bond to form between fin cover face 109 and fin core 106, wherein the epoxy-copper bond may withstand large temperature gradients such as those experienced in soldering operations. Although, fin cover 108 is preferably bonded to fin core 106 via a copper-oxide treatment, fin cover 108 may be bonded to fin core 106 using any adhesion promoting material, device or method suitable to the desired end purpose, such as Silane-based adhesion.

Figure 2:
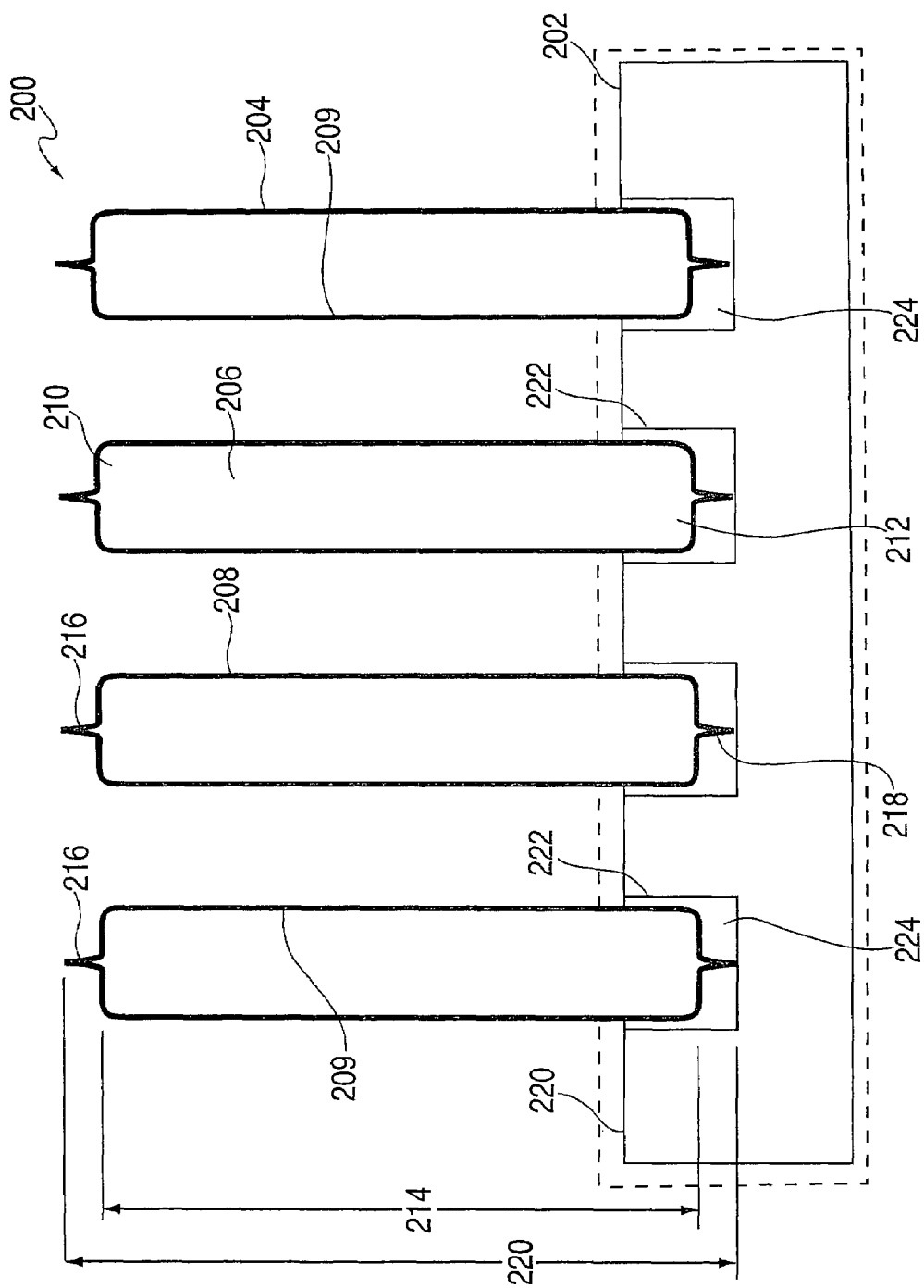
FIG. 2 is a sectional side view of a graphite-epoxy finned heat sink, in accordance with a second embodiment.

Referring to FIG. 2, a finned heat sink 200 in accordance with a second embodiment is shown and discussed. Finned heat sink 200 includes a heat sink base 202 and a plurality of heat sink fins 204. Heat sink fins 204 include a fin core 206 and a fin cover 208, wherein fin cover 208 is non-movably associated with fin core 206. In addition, fin cover 208 is thermally communicated with fin core 206 so as to allow for a maximum amount of heat transfer. Fin core 206 includes a core top 210, a core bottom 212 and has a core length 214. Fin cover 208 includes a cover top 216, a cover bottom 218 and a cover length 220, wherein cover length 220 is preferably larger than core length 214. Fin cover 208 is disposed relative to fin core 206 such that cover top 216 extends beyond core top 210 and cover bottom 218 extends beyond core bottom 212. Cover top 216 and cover bottom 218 are sealed so as to enclose core top 210 and core bottom 212 within fin cover 208.

Heat sink base 202 is preferably constructed of a thermally conductive metallic material and includes a base top 220 having a plurality of fin slots 222. Heat sink base 202 may be constructed of any thermally conductive material suitable to the desired end purpose such as a refractory ceramic (Aluminum-Oxide, Boron-Nitride, Silicon-Carbide). Plurality of heat sink fins 204 are non-movably associated with plurality of fin slots 222 such that heat sink fins 204 are thermally communicated with heat sink base 202 so as to allow efficient thermal transfer between heat sink fins 204 and heat sink base 202. Finned heat sink 200 is formed by non-movably associating one heat sink fin 204 with one fin slot 222 until all of the plurality of fin slots 222 contain a heat sink fin 204.

Although heat sink fins 204 are preferably non-movably associated with fin slots 222 using a thermally conductive soldering material 224, heat sink fins 204 may be non-movably associated with fin slots 222 using any method and/or device suitable to the desired end purpose. Moreover, although cover top 216 and cover bottom 218 are preferably sealed via soldering and/or crimping, cover top 216 and cover bottom 218 may be sealed using any method and/or device suitable to the desired end purpose.

Although fin cover 208 is preferably constructed of 0.375 oz copper foil as known in the circuit board industry, fin cover 208 may be constructed of any material suitable to the desired end purpose. In addition, although fin cover 208 is preferably a solid foil material, fin cover 208 may also be a screened foil material. Moreover, fin cover 208 may be processed to promote material adhesion via any method or device suitable to the desired end purpose such as roughening.

In accordance with a second embodiment, fin cover 208 includes a copper-oxide treatment on fin cover face 209. This copper-oxide treatment advantageously promotes the adhesion of fin cover face 209 to fin core 206. Fin cover face 209 may be bonded to graphite-epoxy material of fin core 206 by compressing fin cover face 209 against fin core 206 while the graphite-epoxy material of fin core 206 is heated to a temperature range in which the graphite-epoxy material is pliable. This advantageously allows an epoxy-copper bond to form between fin cover face 209 and fin core 206, wherein the epoxy-copper bond may withstand large temperature gradients such as those experienced in soldering operations. Although, fin cover 208 is preferably bonded to fin core 206 via a copper-oxide treatment, fin cover 208 may be bonded to fin core 206 using any adhesion promoting material, device or method suitable to the desired end purpose, such as Silane-based adhesion.

Figure 3:
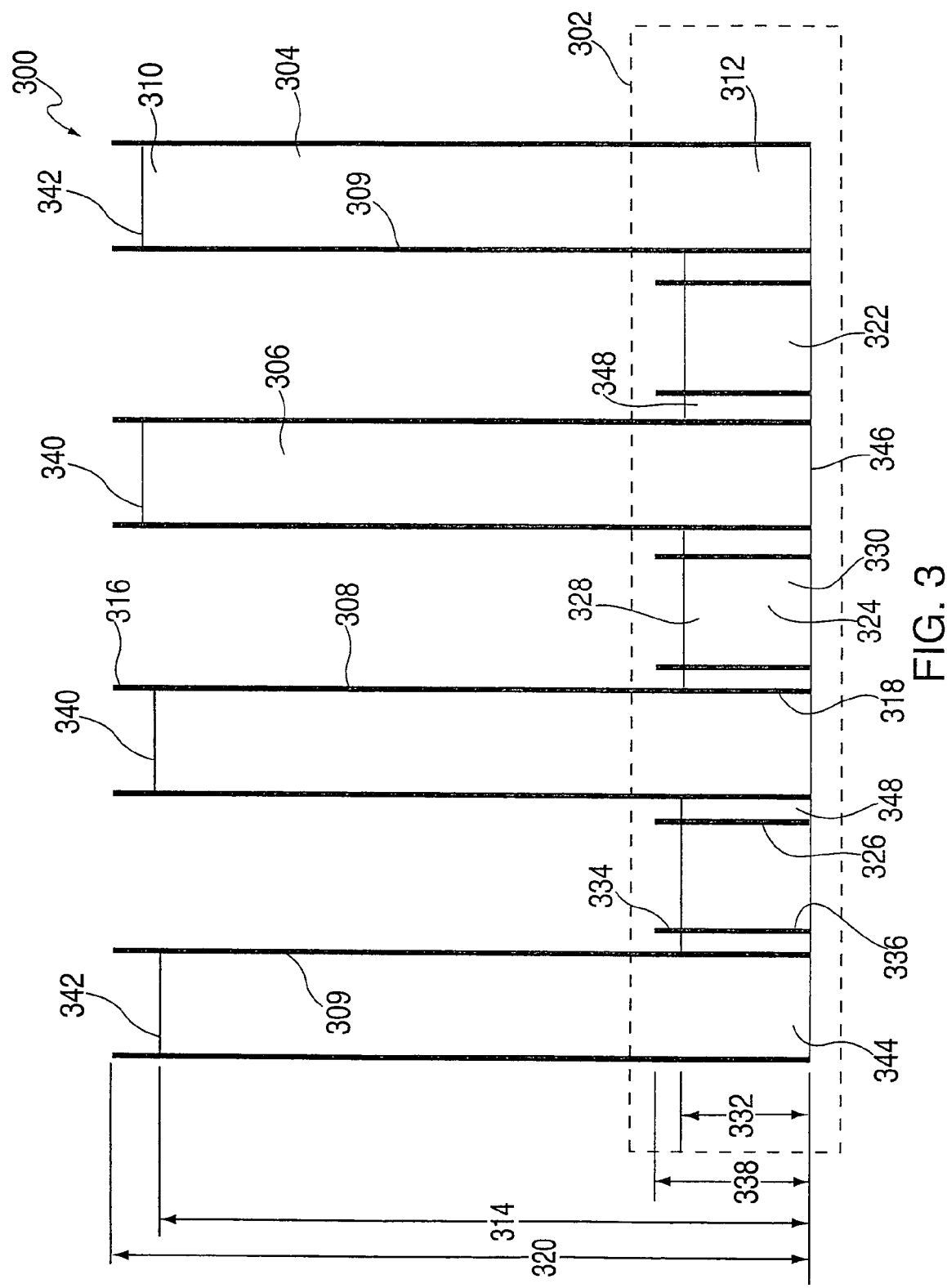
FIG. 3 is a sectional side view of a graphite-epoxy finned heat sink, in accordance with a third embodiment.

Referring to FIG. 3, a finned heat sink 300 in accordance with a third embodiment is shown and discussed. Finned heat sink 300 includes a heat sink base 302 and a plurality of heat sink fins 304. Heat sink fins 304 include a fin core 306 and a fin cover 308, wherein fin cover 308 is non-movably associated with fin core 306. In addition, fin cover 308 is thermally communicated with fin core 306 so as to allow for a maximum amount of heat transfer. Fin core 306 includes a core top 310, a core bottom 312 and has a core length 314. Fin cover 308 includes a cover top 316, a cover bottom 318 and a cover length 320, wherein cover length 320 is preferably larger than core length 314. Fin cover 308 is disposed relative to fin core 306 such that cover bottom 318 is adjacent to core bottom 312 and cover top 316 extends beyond core top 310.

Heat sink base 302 includes a plurality of fin spacers 322 having a spacer core 324 and a spacer cover 326, wherein spacer cover 326 is non-movably associated with spacer core 324. In addition, spacer cover 326 is thermally communicated with spacer core 324 so as to allow for a maximum amount of heat transfer. Spacer core 324 includes a spacer core top 328, a spacer core bottom 330 and a spacer core length 332. Spacer cover 326 includes a spacer cover top 334, a spacer cover bottom 336 and a spacer cover length 338, wherein spacer cover length 338 is preferably larger than spacer core length 332. Spacer cover 326 is disposed relative to spacer core 324 such that spacer cover bottom 336 is adjacent to spacer core bottom 330 and spacer cover top 334 extends beyond spacer core top 328.

Finned heat sink 300 includes a plurality of internal heat sink fins 340 and a plurality of external heat sink fins 342 and is formed by positioning internal heat sink fins 340 between external heat sink fins 342 in a sandwich fashion such that external heat sink fins 342 are disposed on the outer most portion of finned heat sink 300. External heat sink fins 342 are disposed so as to be parallel to internal heat sink fins 340 such that core top 310 of each heat sink fin 304 is adjacent to the core top 310 of the neighboring heat sink fin 304. Fin spacers 322 are non-movably disposed between heat sink fins 304 in a sandwich fashion so as to separate heat sink fins 304 from each other such that core bottom 312 is adjacent to spacer core bottom 330. In addition, heat sink fins 304 are preferably thermally communicated with fin spacers 322 so as to allow efficient thermal transfer between heat sink fins 304 and fin spacers 322.

Heat sink base 302 also includes a base bottom 344 having a bottom material layer 346 constructed of a thermally conductive material, wherein bottom material layer 346 is disposed so as to seal cover bottom 318 to core bottom 312 and spacer cover bottom 336 to spacer core bottom 330.

The graphite-epoxy material of fin core 306 is advantageously contained within fin cover 308 preventing the contamination of neighboring hardware with graphite-epoxy debris. This is because cover top 316 is extended past core top 310 so as to contain graphite-epoxy debris and cover bottom 318 is sealed by bottom material layer 346 so as to enclose core bottom 312 within fin cover 308. In addition, this advantageously allows fin core 306 to be contained with fin cover 308 without the problems associated with electroless nickel plating.

Although fin cover 308 is preferably constructed of 0.375 oz copper foil as known in the circuit board industry, fin cover 308 may be constructed of any material suitable to the desired end purpose, such as aluminum. In addition, although fin cover 308 is preferably a solid foil material, fin cover 308 may also be a screened foil material. Moreover, fin cover 308 may be processed to promote material adhesion via any method or device suitable to the desired end purpose such as roughening.

Although heat sink fins 304 and fin spacers 322 are preferably non-movably associated using a thermally conductive soldering material 348, heat sink fins 304 and fin spacers 322 may be non-movably associated using any method and/or device suitable to the desired end purpose. In addition, bottom material layer 346 may be non-movably associated with base bottom 344 via any method and/or device suitable to the desired end purpose, such as electroplating, physical vapor deposition and/or sputtering.

In accordance with a third embodiment, fin cover 308 includes a copper-oxide treatment on fin cover face 309. This copper-oxide treatment advantageously promotes the adhesion of fin cover face 309 to fin core 306. Fin cover face 309 may be bonded to graphite-epoxy material of fin core 306 by compressing fin cover face 309 against fin core 306 while the graphite-epoxy material of fin core 306 is heated to a temperature range in which the graphite-epoxy material is pliable. This advantageously allows an epoxy-copper bond to form between fin cover face 309 and fin core 306, wherein the epoxy-copper bond may withstand large temperature gradients such as those experienced in soldering operations. Although, fin cover 308 is preferably bonded to fin core 306 via a copper-oxide treatment, fin cover 308 may be bonded to fin core 306 using any adhesion promoting material, device or method suitable to the desired end purpose, such as Silane-based adhesion.

Figure 4:
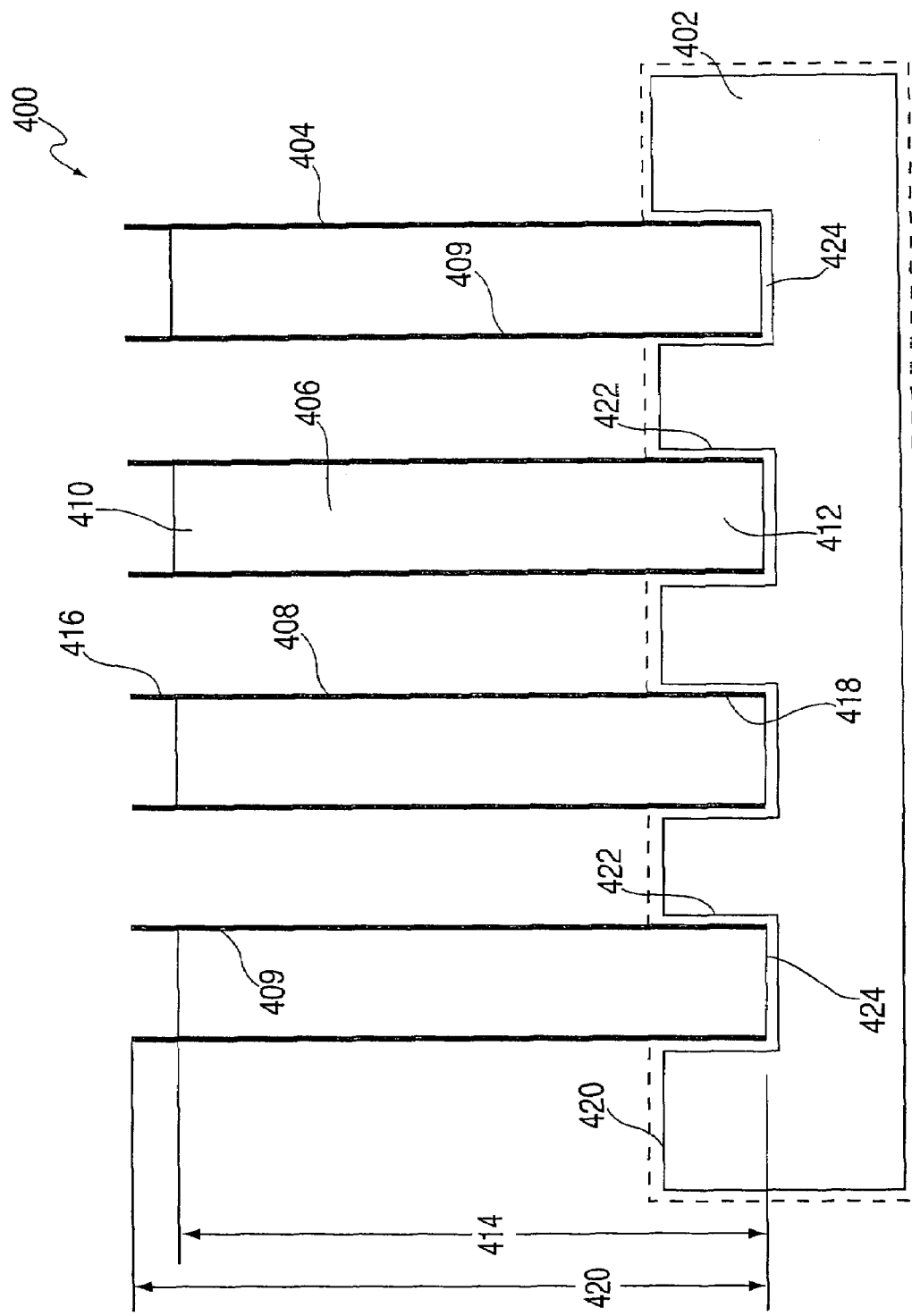
FIG. 4 is a sectional side view of a graphite-epoxy finned heat sink, in accordance with a fourth embodiment.

Referring to FIG. 4, a finned heat sink 400 in accordance with a fourth embodiment is shown and discussed. Finned heat sink 400 includes a heat sink base 402 and a plurality of heat sink fins 404. Heat sink fins 404 include a fin core 406 and a fin cover 408, wherein fin cover 408 is non-movably associated with fin core 406. In addition, fin cover 408 is thermally communicated with fin core 406 so as to allow for a maximum amount of heat transfer. Fin core 406 includes a core top 410, a core bottom 412 and has a core length 414. Fin cover 408 includes a cover top 416, a cover bottom 418 and a cover length 420, wherein cover length 420 is preferably larger than core length 414. Fin cover 408 is disposed relative to fin core 406 such that cover top 416 extends beyond core top 410 and cover bottom 418 is adjacent to core bottom 412.

Heat sink base 402 is preferably constructed of a thermally conductive metallic material and includes a base top 420 having a plurality of fin slots 422. Heat sink base 402 may be constructed of any thermally conductive material suitable to the desired end purpose such as a refractory ceramic (Aluminum-Oxide, Boron-Nitride, Silicon-Carbide). Plurality of heat sink fins 404 are non-movably associated with plurality of fin slots 422 such that heat sink fins 404 are thermally communicated with heat sink base 402 so as to allow efficient thermal transfer between heat sink fins 404 and heat sink base 402. Finned heat sink 400 is formed by non-movably associating one heat sink fin 404 with one fin slot 422 until all of the plurality of fin slots 422 contain a heat sink fin 404.

Although fin cover 408 is preferably constructed of 0.375 oz copper foil as known in the circuit board industry, fin cover 408 may be constructed of any material suitable to the desired end purpose. In addition, although fin cover 408 is preferably a solid foil material, fin cover 408 may also be a screened foil material. In accordance with a first embodiment, fin cover 408 includes a copper-oxide treatment on fin cover face 409. This copper-oxide treatment advantageously promotes the adhesion of fin cover face 409 to fin core 406. Fin cover face 409 may be bonded to graphite-epoxy material of fin core 406 by compressing fin cover face 409 against fin core 406 while the graphite-epoxy material of fin core 406 is heated to a temperature range in which the graphite-epoxy material is pliable. This advantageously allows an epoxy-copper bond to form between fin cover face 409 and fin core 406, wherein the epoxy-copper bond may withstand large temperature gradients such as those experienced in soldering operations. Although, fin cover 408 is preferably bonded to fin core 406 via a copper-oxide treatment, fin cover 408 may be bonded to fin core 406 using any adhesion promoting material, device or method suitable to the desired end purpose, such as Silane-based adhesion. Moreover, fin cover 408 may be processed to promote material adhesion via any method or device suitable to the desired end purpose such as roughening.

Although heat sink fins 404 are preferably non-movably associated with fin slots 422 using a thermally conductive soldering material 424, heat sink fins 404 may be non-movably associated with fin slots 422 using any method and/or device suitable to the desired end purpose.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

We claim:

1. A method of manufacturing a finned heat sink comprising:
   obtaining a plurality of fin cores, wherein each of said fin cores is constructed of a conductive structural graphite-epoxy material;
   securing a fin cover to each of said fin cores using one of heat and pressure to define heat sink fins, wherein said fin cover is constructed of a foil material;
   placing said heat sink fins in thermal communication with a heat sink base, the heat sink fins being spaced apart to define air gaps between the heat sink fins.

2. The method of claim 1 wherein:
said securing includes using heat and pressure to establish a bond between epoxy of said fin core and said fin cover.

3. The method of claim 2 wherein:
said fin cover is constructed from copper.

4. The method of claim 3 wherein:
said fin cover has a face contacting said fin core, said face being processed to promote said bond.

5. The method of claim 4 wherein:
wherein said face is oxidized to promote said bond.

6. The method of claim 5 wherein:
wherein said fin cover is made from copper and said face has a copper-oxide treatment.

7. The method of claim 1 further comprising:
sealing at least one end of said fin cover to enclose one end of said fin core.

8. The method of claim 1 further comprising:
sealing both ends of said fin cover to enclose both ends of said fin core.

9. The method of claim 1 wherein:
placing said heat sink fins in thermal communication with a heat sink base includes joining one of said heat sink fins with a further one of said heat sink fins by securing said one of said heat sink fins and said further one of said heat sink fins on opposite sides of a spacer, said spacer contacting both of said one of said heat sink fins and said further one of said heat sink fins.

10. The method of claim 9 wherein:
said spacer has fin core constructed of a conductive structural graphite-epoxy material and a fin cover constructed of foil material secured to said fin core.

* * * * *